(12) United States Patent
Lourdel et al.

(10) Patent No.: US 8,022,697 B2
(45) Date of Patent: Sep. 20, 2011

(54) SYSTEM FOR MEASURING AN ELECTROMAGNETIC FIELD, A CONTROL SYSTEM USING THE MEASURING SYSTEM, AND AN ELECTRONIC CIRCUIT DESIGNED FOR THE MEASURING SYSTEM

(75) Inventors: Guillaume Lourdel, Tarbes (FR); Emmanuel Dutarde, Mirepeix (FR); Jean-Marc Dienot, Orleix (FR)

(73) Assignee: Alstom Transport SA, Levallois-Perret (FR)

( * ) Notice: Subject to any disclaimer, the term of this patent is extended or adjusted under 35 U.S.C. 154(b) by 129 days.

(21) Appl. No.: 12/394,920

(22) Filed: Feb. 27, 2009

(65) Prior Publication Data

US 2009/0160438 A1  Jun. 25, 2009

Related U.S. Application Data

(62) Division of application No. 11/128,425, filed on May 13, 2005, now abandoned.

(30) Foreign Application Priority Data

May 14, 2004  (FR) ...................................... 04 05299

(51) Int. Cl.
*G01R 33/00* (2006.01)

(52) U.S. Cl. ........................................................ 324/260
(58) Field of Classification Search .................. None
See application file for complete search history.

(56) References Cited

U.S. PATENT DOCUMENTS

| | | | |
|---|---|---|---|
| 3,686,518 A * | 8/1972 | Hartmann et al. | 310/313 B |
| 4,777,579 A | 10/1988 | Jahns et al. | |
| 4,904,925 A | 2/1990 | Pereira | |
| 5,025,344 A | 6/1991 | Maly et al. | |
| 5,260,653 A | 11/1993 | Smith et al. | |
| 5,617,071 A | 4/1997 | Daughton | |
| 5,705,852 A * | 1/1998 | Orihara et al. | 257/679 |
| 5,831,426 A | 11/1998 | Black et al. | |
| 5,834,864 A * | 11/1998 | Hesterman et al. | 310/40 MM |
| 6,087,842 A | 7/2000 | Parker et al. | |
| 6,300,617 B1 | 10/2001 | Daughton et al. | |
| 6,380,752 B1 | 4/2002 | Irino | |
| 6,844,725 B2 | 1/2005 | Hoshino | |
| 7,259,545 B2 | 8/2007 | Stauth et al. | |

* cited by examiner

*Primary Examiner* — Paresh Patel
(74) *Attorney, Agent, or Firm* — Sughrue Mion, PLLC

(57) ABSTRACT

This system for measuring an electromagnetic field radiated by an electrical component of an electronic circuit, the electrical component being fixed to a dielectric substrate of the electronic circuit, is wherein a transducer (90 to 95) is etched on the substrate of the electronic circuit.

4 Claims, 3 Drawing Sheets

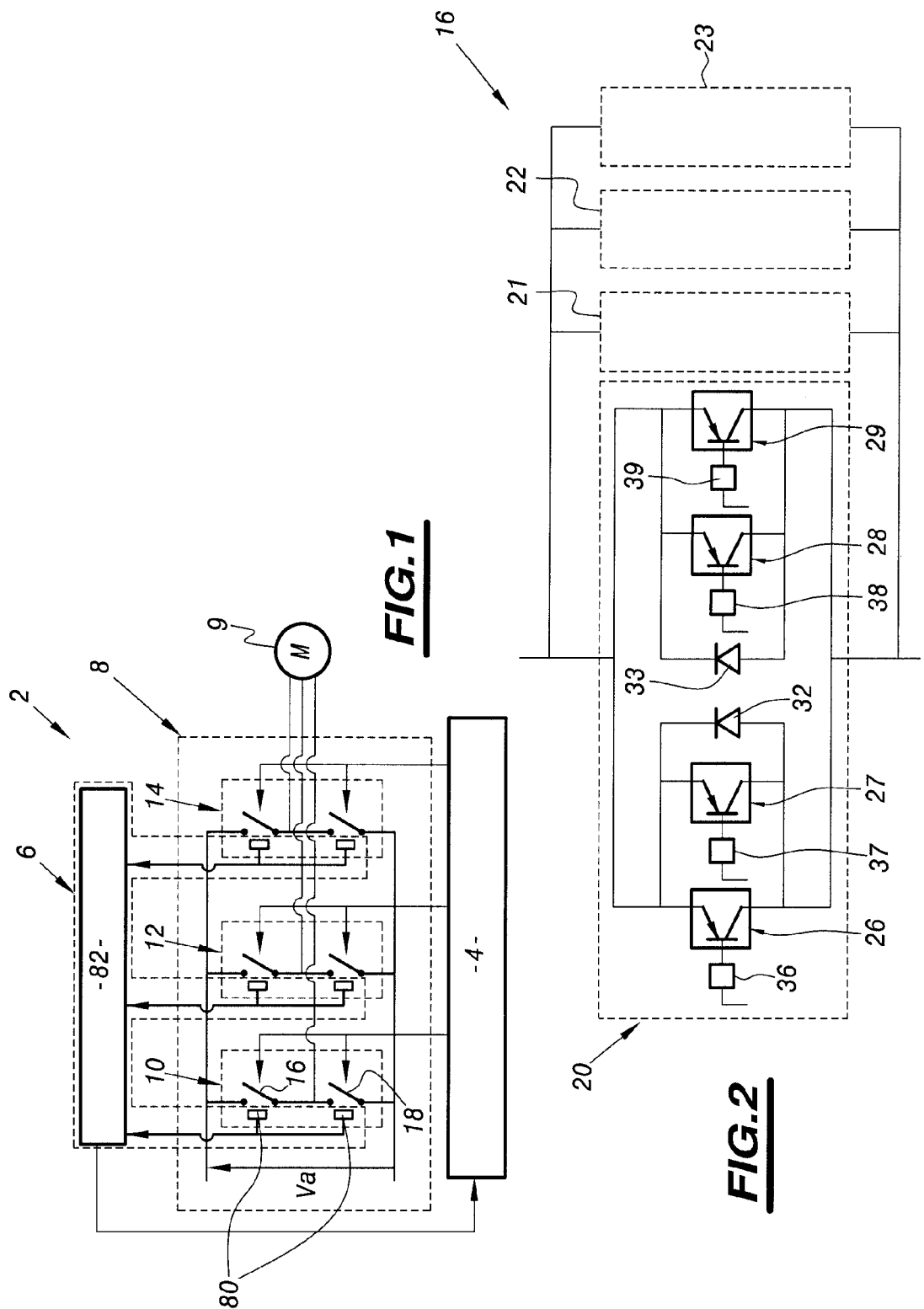

SYSTEM FOR MEASURING AN ELECTROMAGNETIC FIELD, A CONTROL SYSTEM USING THE MEASURING SYSTEM, AND AN ELECTRONIC CIRCUIT DESIGNED FOR THE MEASURING SYSTEM

CROSS REFERENCE TO RELATED APPLICATIONS

This is a Divisional of Application No. 11/128,425 filed May 13, 2005. The entire disclosure of the prior application is hereby incorporated by reference.

The present invention relates to a system for measuring an electromagnetic field, to control system using the measuring system, and to an electronic circuit designed for the measuring system.

BACKGROUND OF THE INVENTION

Prior art systems for measuring an electromagnetic field radiated by an electrical component of an electronic circuit comprise:
  a unit for measuring electrical energy independent of the electronic circuit, and
  a transducer connected to the measuring unit and adapted to convert the electromagnetic field radiated by the electrical component into electrical energy measured by the measuring unit.

In prior art systems, the transducer is independent of the electronic circuit and must be placed manually in the vicinity of the place on the electronic circuit where the electromagnetic radiation is to be measured. However, the spatial resolution of measurements made using prior art systems is less than perfect, among other things because of inaccurate positioning of the transducer relative to the electronic circuit.

OBJECTS AND SUMMARY OF THE INVENTION

The invention aims to remedy this drawback by proposing a system for measuring with improved spatial resolution the electromagnetic field radiated by an electronic circuit.

The invention therefore consists in a system as described hereinabove for measuring an electromagnetic field wherein the transducer is etched onto the substrate of the electronic circuit.

Since the transducer is etched onto the substrate of the electronic circuit, it is accurately positioned within the electronic circuit itself. Problems of inaccuracies caused by imperfect positioning of the transducer relative to the electronic circuit are therefore solved.

Embodiments of the above measuring system may have one or more of the following features:
  the transducer includes a coil and the measuring unit is adapted to measure the current in that coil;
  the coil is formed of a looped track etched on the substrate and whose two ends form lands for connecting the coil to the measuring unit;
  the coil has only one turn;
  for an electronic circuit in which the electronic component whose radiated electronic field is to be measured is a track connecting in parallel first and second current switching chips, the transducer is etched on the substrate at a location chosen to be more exposed to the electromagnetic field generated by the current switched by the first chip than that generated by the current switched by the second chip.

The invention also provides an electronic circuit comprising:
  a dielectric substrate, and
  an electrical component fixed to the substrate and whose electromagnetic radiation must be measured,
which circuit includes a transducer of a measuring system according to the invention etched on the substrate to measure the electromagnetic field radiated by the electrical component.

Embodiments of the above electronic circuit may have one or more of the following features:
  the electrical component is a track etched on one face of the substrate and the transducer of the measuring system is etched alongside this track on the same face of the substrate;
  the electrical component is a track etched on one face of the substrate and the transducer of the measuring system is etched on an opposite face of the substrate;
  the electronic circuit is a power switch module including a first switching chip and a second switching chip connected in parallel by the track whose electromagnetic radiation is to be measured;
  the circuit includes a first transducer etched on the substrate at a location chosen to be more exposed to the electromagnetic field generated by the current switched by the first chip than to that generated by the current switched by the second chip.

The invention further provides a power switching system including:
  a power switch module including a first switching chip, a second switching chip and a dielectric substrate on which a track connecting the first and second switching chips in parallel is etched, and
  a control unit for controlling the operation of the power switch module,
which system:
  includes a measuring system according to the invention equipped with a transducer etched on the substrate of the power switch module at a location more exposed to the magnetic field generated by the current switched by the first chip than to that generated by the current switched by the second chip, and
  the control unit is adapted to control the operation of one or more of the chips as a function of the measurements carried out by the measuring system.

BRIEF DESCRIPTION OF THE DRAWINGS

The invention will be better understood after reading the following description, which is given by way of example only and with reference to the drawings, in which:

FIG. 1 is a diagram of a switching system comprising a plurality of switches;

FIG. 2 is a partial diagram of one of the switches of the FIG. 1 system;

MORE DETAILED DESCRIPTION

Figure 3:
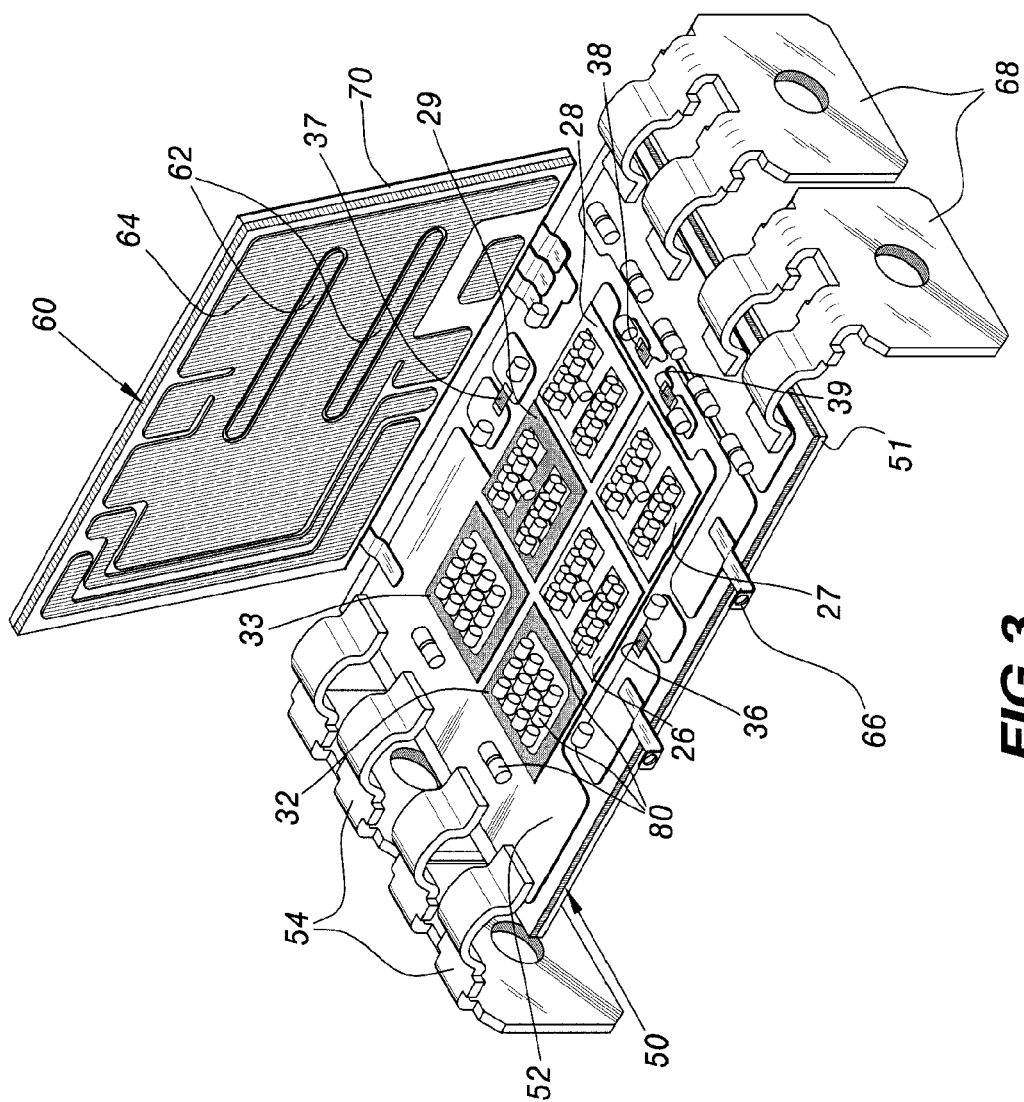
FIG. 3 is an exploded view of a switch module used in one of the switches of the FIG. 2 diagram.

FIG. 1 represents a switching system 2 comprising power switches with an associated control unit 4. The system 2 also includes a measuring system 6 for measuring the electromagnetic field generated by the currents switched by the switches.

The system 2 is described here in a situation in which the switches form a three-phase inverter 8 for supplying power to a rotating electrical machine 9 such as a traction motor of a train.

The circuit of the inverter 8 is conventional. Each of three identical electrical phases 10, 12 and 14 is formed of two identical power switches 16 and 18. Here each power switch is adapted to switch currents of several thousand amperes and able to resist potential differences of several thousand volts.

To this end, each switch is formed of a plurality of switch modules connected in parallel.

FIG. 2 represents an example of a switch formed of four identical switch modules 20 to 23. Only the switch module 20 is represented in detail.

For example, each switch module comprises four chips 26 to 29 connected in parallel and two diodes 32, 33 connected in antiparallel with the chips. Each chip functions as a transistor and has a gate electrode, a collector electrode and an emitter electrode.

Each chip is capable of supporting a voltage of 3000 volts and a maximum nominal current of 150 amperes, for example. To this end, each chip comprises a matrix of insulated gate bipolar transistors (IGBTs) connected in parallel and/or in series. The gate of each IGBT is connected to the gate electrode of the chip so that all the IGBTs function like a single transistor of greater performance. Connecting the IGBTs in parallel produces a chip capable of switching a much higher current than the current that each of the transistors that constitute it can withstand.

The gate electrode of each of the chips 26 to 29 is connected to a gate pin via a respective resistor 36 to 39.

FIG. 3 is an exploded perspective view of the structure of the switch module 20, which includes a substrate 50 formed of an electrically insulative material such as a dielectric material. The substantially rectangular substrate 50 is disposed horizontally and has an exterior face that faces downwards and an interior face on the opposite side that faces upwards.

The exterior face is uniformly covered with a thin layer 51 of metal to form an electromagnetic screen.

Tracks 52 connecting the collector electrodes of the chips 26 to 29 to collector pins 54 are etched on the interior face of the substrate 50. These collector pins 54 are welded to the tracks 52 and project outwards on the rear shorter side of the substrate 50.

Each chip has two opposite plane faces. In FIG. 3, the lower face of each chip carries the collector electrodes and the upper face carries the gate and emitter electrodes.

The collector electrode of each of the chips 26 to 29 and the cathodes of the diodes 32 and 33 are soldered to the tracks 52. In addition to making an electrical connection, soldering provides a thermal connection between the collector electrode and the substrate 50.

The switch module 20 also has a rectangular upper substrate 60 formed from an electrically insulative material such as a dielectric material. This substrate 60 has two opposite plane faces, one of which is an interior face that faces towards the substrate 50. Tracks 62, 64 are etched on the interior face of this substrate 60. The track 62 connects the gate electrodes of the chips 26 to 29 to a gate pin 66 via the resistors 36 to 39. The track 64 connects the emitter electrodes of the chips 26 to 29 to emitter pins 68 and has a large surface area to encourage evacuation of heat to the exterior for efficient cooling for the chips, for example.

Here, the gate and emitter pins 66, 68 are fixed to the substrate 50.

The substrate 60 has an exterior face on the side opposite the interior face and onto which a thin layer of metal 70 is deposited to form an electromagnetic screen.

The system 6 for measuring the electromagnetic field generated by the currents switched by the switches 16 and 18 of the inverter 8 includes a set 80 of transducers associated with each of the switches 16 and 18 (see FIG. 1). Each of the transducers of this set 80 is adapted to convert an electromagnetic field into a current or a voltage.

The system also includes a unit 82 for measuring the current or voltage generated by each of the transducers of the set 80.

The control unit 4 is connected to the system 6 to control operation of the switches 16 and 18 as a function of the measurements effected by the system 6. In particular, the unit 4 is adapted to control the switching speed of each of the switch modules forming the switches 16 and 18 as a function of the switching speed of each chip, which is deduced from measurements effected by the system 6.

Figure 4:
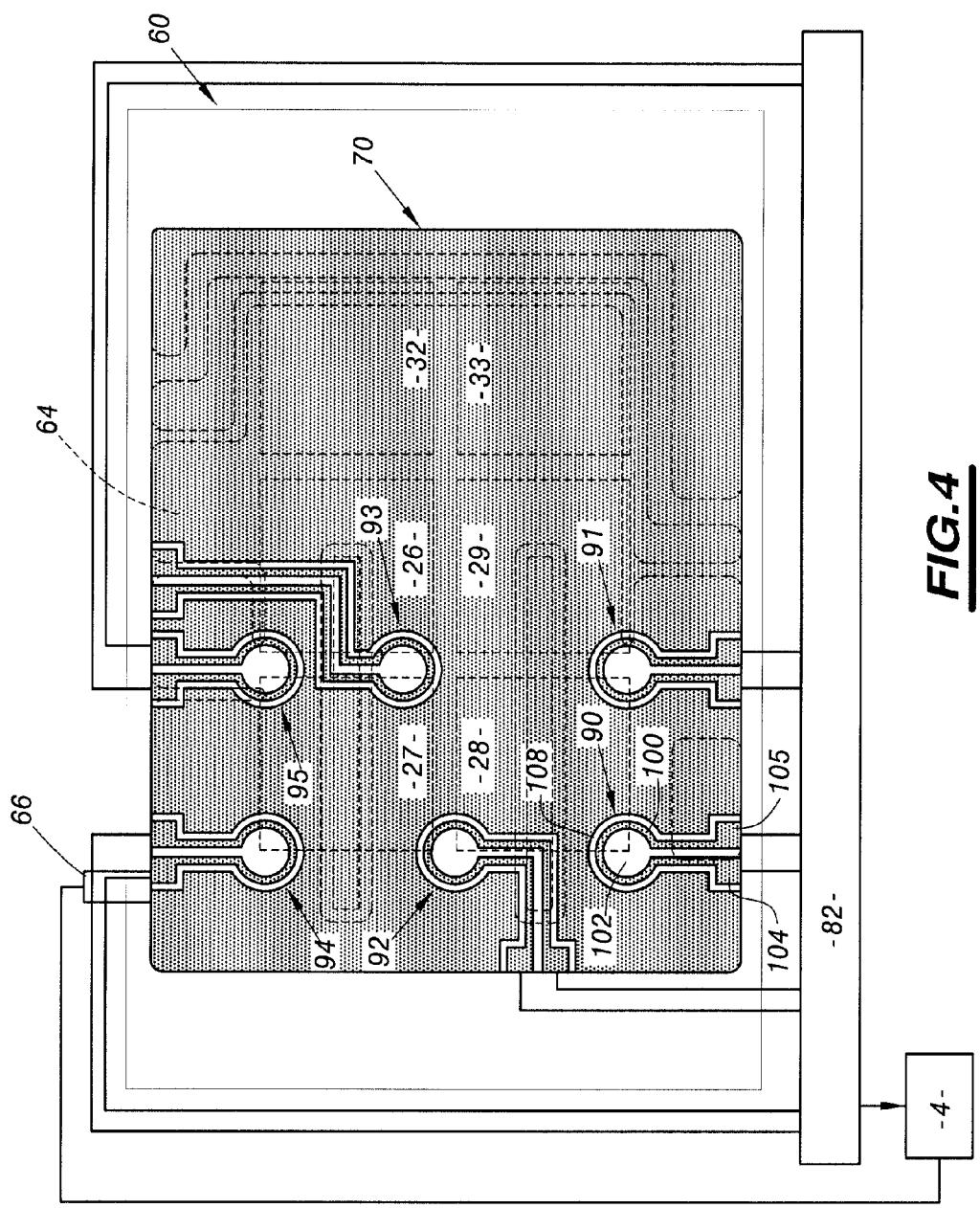
FIG. 4 is a plan view of the FIG. 3 switch module.

FIG. 4 is a plan view of the exterior surface of the substrate 60. The positions of the tracks 60 and 62, the diodes 32 and 33 and the chips 26 to 29 are represented by dashed lines in this figure.

In this embodiment, the transducers of the set 80 are etched in the thin metal layer 70. Each of six identical transducers 90 to 95 is a coil adapted to convert a varying magnetic field into a current.

Only the transducer 90 will be described in detail.

The transducer 90 includes a track 100 forming a loop around a surface 102 from which the conductive part has been removed. The ends of this loop 100 are widened to form lands 104 and 105 for connecting the loop 100 to the unit 82. These lands 104 and 105 are formed at the periphery of the thin metal layer 70 so that they are easy to connect to the unit 82. Each transducer is connected to the unit 82 by wires welded at one end to the connecting lands, for example.

The surface 102 forms a circle whose radius is five millimeters. The loop 100 is electrically isolated from the thin metal layer 70 by a strip 108 one millimeter wide from which the conductive part has been removed. The width of the track 100 is approximately one millimeter.

The position and dimensions of each transducer 90 to 95 are selected in order to measure the electromagnetic field at a particular place in the switch module 20. In the present example, each transducer 90 to 95 is placed to measure the magnetic field created by the current switched by a respective chip, as described in more detail below.

The operation of the system 2 will now be described.

The unit 4 commands each of the chips of each of the switches 16 and 18 of the inverter 8 to switch from an off state to an on state or vice-versa. The effect of this switching is to vary the current in the track 64, which varies the magnetic field radiated by the track 64. This variation of the radiated magnetic field varies the magnetic flux crossing the surface 102 of each transducer. This variation of the magnetic flux crossing the surface 102 generates an electrical current in the track 100 connected to the unit 82, which measures that electrical current. From the measured current, the unit 82 deduces information on the current switched by the chips. For example, the unit 82 determines the switching time and the rate of variation $$\frac{di}{dt}$$

of the switched current and sends this information to the control unit 4. The unit 4 commands the chips to increase or reduce the switching speed as a function of this information, for example.

To be more precise, because of fabrication tolerances, for example, the chips 26 to 29 do not have exactly the same technical characteristics and operate slightly differently. For example, these chips may have slightly different switching times. Because of these differences, and the large area of the track 64, the density of the switched current is not uniform over the whole of the surface of the track 64. The invention exploits this non-uniform current density in association with different characteristics or different operation to obtain information on the operation of each of the chips. This is possible because each transducer is essentially sensitive to the magnetic field created by the density of the current switched in the area of the track 64 facing the surface 102. By placing a transducer opposite a surface of the track 64 whose current density is representative of the current switched by a single chip, this transducer therefore measures the current switched by that chip alone, and not by all of the chips connected to the track 64. The unit 82 processes the signals produced by this transducer and deduces from them information on the operation of this particular chip, for example the switching (opening and/or closing) time. Here, the unit 82 delivers this switching time to the control unit 4, which then uses the information to control the chips.

This switching time information enables failure of a chip to be predicted. In this example, the unit 4 is also adapted to command the switch module 20 to go to a safe state before the faulty chip can explode.

Still with the aim of obtaining information on the operation of a particular chip of the set of chips forming the switch module 20, the size of the surface 102 is chosen to cover only a portion of the total width of the track 64. Here, the size of the surface 102 is also chosen to represent a good compromise between the spatial resolution of the transducer, which increases as the size of the surface 102 decreases, and its sensitivity, which decreases as the size of the surface 102 decreases.

The system 6 has many advantages. In particular, measuring errors caused by inaccurate positioning of the transducer relative to the track whose electromagnetic radiation is to be measured are avoided because the transducer is etched into the same substrate as the track. Etching the transducers in the thin metal layer forming the electromagnetic screen allows measurement of the electromagnetic field inside the switch module, even though it is fitted with an electromagnetic screen.

The transducers 90 to 95 have been described in the particular situation in which they are etched on a face of the substrate on the opposite side to that on which the track whose electromagnetic radiation is to be measured is formed. In a configuration of this kind, the transducers do not occupy any space on the "active" face of the substrate, i.e. the face carrying the tracks of the switch module. However, as an alternative to this, the transducers may be etched alongside the track whose electromagnetic radiation is to be measured and on the same face of the substrate as the track. This configuration has the advantage of increasing the sensitivity of the transducer, since it is better exposed to the magnetic flux generated by the track.

The transducers have been described in the particular situation in which they take the form of a coil comprising a single turn formed by the track 100. Alternatively, for improved sensitivity, the coil with one turn is replaced by a coil with multiple turns etched on the substrate of the switch module.

The transducers are described hereinabove in the particular situation in which they comprise a track 100 delimiting a circular surface 102 whose radius is five millimeters. For enhanced spatial resolution, it is possible to reduce that radius. It is also possible to increase the radius of the surface 102 to increase the sensitivity of the transducer.

The system 6 is able to measure the electromagnetic radiation of other electrical components fixed to a substrate of an electronic circuit, not merely that of a track. For example, the system 6 may instead be adapted to measure the electromagnetic field of an electrical component welded to the substrate, such as an electrical relay, transistor or microcontroller.

Finally, the system 6 has been described in the particular situation in which it is applied to measuring magnetic fields generated by a track of a power switch module. However, the teaching of the present invention is not limited to switch modules of that kind, but applies to all types of electronic circuits including a substrate on which may be etched a transducer and preferably an electrical coil forming a transducer. For example, the system 6 may be applied to electronic cards having analog or digital electronic components soldered to a substrate, or to integrated circuits. In the case of integrated circuits, the dimensions of a transducer are of the order of a few micrometers, for example.

What is claimed is:

1. A system for measuring an electromagnetic field radiated by an electrical component of an electronic circuit, the electrical component being fixed to a dielectric substrate of the electronic circuit, and a thin layer of metal being deposited onto at least one face of the substrate and forming an electromagnetic screen, the system comprising:
   a unit (82) for measuring electrical energy independent of the electronic circuit, and
   a transducer (90 to 95) connected to the measuring unit and adapted to convert the electromagnetic field radiated by the electrical component into electrical energy measured by the measuring unit,
   wherein the transducer is etched in the thin layer of metal onto the substrate of the electronic circuit.

2. A system according to claim 1, wherein the transducer (90 to 95) includes a coil and the measuring unit is adapted to measure the current in that coil.

3. A system according to claim 2, wherein the coil is formed of a looped track (100) etched on the substrate and whose two ends form lands for connecting the coil to the measuring unit.

4. A system according to claim 2, wherein the coil has only one turn.

* * * * *